(12) United States Patent
Mitros et al.

(10) Patent No.: US 7,045,418 B2
(45) Date of Patent: May 16, 2006

(54) SEMICONDUCTOR DEVICE INCLUDING A DIELECTRIC LAYER HAVING A GETTERING MATERIAL LOCATED THEREIN AND A METHOD OF MANUFACTURE THEREFOR

(75) Inventors: Jozef Mitros, Richardson, TX (US); Weidong Tian, Dallas, TX (US); Pinghai Hao, Plano, TX (US); Victor Ivanov, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 10/387,164

(22) Filed: Mar. 12, 2003

(65) Prior Publication Data

US 2004/0178438 A1    Sep. 16, 2004

(51) Int. Cl.
 *H01L 21/336*    (2006.01)
 *H01L 29/76*    (2006.01)

(52) U.S. Cl. .................. 438/257; 257/314; 257/913

(58) Field of Classification Search ........ 257/314–321, 257/E21.318, E21.321, 913; 438/58, 143, 438/310, 402, 471, FOR. 144, 257–267
See application file for complete search history.

(56) References Cited

U.S. PATENT DOCUMENTS

| | | | | |
|---|---|---|---|---|
| 3,933,530 A | * | 1/1976 | Mueller et al. | 438/474 |
| 4,814,854 A | * | 3/1989 | Tigelaar et al. | 257/382 |
| 4,971,924 A | * | 11/1990 | Tigelaar et al. | 438/396 |
| 5,215,933 A | * | 6/1993 | Araki | 438/143 |
| 5,393,686 A | * | 2/1995 | Yeh et al. | 438/264 |
| 5,502,321 A | * | 3/1996 | Matsushita | 257/316 |
| 6,207,989 B1 | * | 3/2001 | Li et al. | 257/314 |
| 6,762,446 B1 | * | 7/2004 | Amiotti et al. | 257/296 |

FOREIGN PATENT DOCUMENTS

JP     2000236030 A  *  8/2000

* cited by examiner

*Primary Examiner*—Brook Kebede
(74) *Attorney, Agent, or Firm*—Peter K. McLarty; W. James Brady, III; Frederick J. Telecky, Jr.

(57) ABSTRACT

The present invention provides a semiconductor device (200), a method of manufacture therefor and an integrated circuit including the same. In one embodiment of the invention, the semiconductor device (200) includes a floating gate (230) located over a semiconductor substrate (210), wherein the floating gate (230) has a metal control gate (250) located thereover. The semiconductor device (200), in the same embodiment, further includes a dielectric layer (240) located between the floating gate 230 and the metal control gate (250), the dielectric layer (240) having a gettering material located therein.

22 Claims, 10 Drawing Sheets

| TYPE | Negative Q | | Positive Q | | COMMENTS |
|---|---|---|---|---|---|
| | $V_T$ | $dV_T$ | $dV_T(\%)$ | $V_T$ | $dV_T$ | $dV_T(\%)$ | |

| TYPE | $V_T$ | $dV_T$ | $dV_T(\%)$ | $V_T$ | $dV_T$ | $dV_T(\%)$ | COMMENTS |
|---|---|---|---|---|---|---|---|
| n-channel | 6.6 | 4.56 | 69% | -1.92 | -0.11 | 6% | Standard TEOS |
| p-channel | 2.96 | 3.94 | 133% | -5.38 | -0.11 | 2% | |
| n-channel | 6.93 | 2.89 | 42% | -2.34 | -0.13 | 6% | TEOS implanted with 2E15 atoms/cm² of Fluorine |
| p-channel | 3.26 | 2.42 | 74% | -5.86 | -0.1 | 2% | |

| Bake Time [hrs] | $V_t$ for negative Q in fl.gate | | | $dV_t$ for neg.Q | | | $V_t$ for positive Q in fl.gate | | | $dV_t$ for posit.Q | |
|---|---|---|---|---|---|---|---|---|---|---|---|
| | 0 | 6 | 840 | | 6 | 840 | 0 | 6 | 840 | 6 | 840 |
| std TEOS | 6.34 | 1.79 | 1.40 | | 4.54 | 4.94 | -2.50 | -2.05 | -1.05 | -0.45 | -1.45 |
| 4E15 P atoms/cm² | 6.40 | 5.49 | 3.71 | | 0.92 | 2.70 | -2.50 | -1.86 | -1.02 | -0.63 | -1.48 |
| 13E15 P atoms/cm² | 6.33 | 5.60 | 3.85 | | 0.72 | 2.48 | -2.36 | -1.92 | -0.57 | -0.44 | -1.79 |

SEMICONDUCTOR DEVICE INCLUDING A DIELECTRIC LAYER HAVING A GETTERING MATERIAL LOCATED THEREIN AND A METHOD OF MANUFACTURE THEREFOR

TECHNICAL FIELD OF THE INVENTION

The present invention is directed, in general, to a semiconductor device and, more specifically, to a semiconductor device including a dielectric layer having a gettering material located therein and a method of manufacture therefor.

BACKGROUND OF THE INVENTION

An electrically erasable programable read only memory (EEPROM) is a user-modifiable read-only memory that can be erased and reprogrammed repeatedly through the application of higher than normal electrical voltage. In general, EEPROM cells have proven to be a reliable and versatile form of nonvolatile reprogrammable memory.

Figure 1:
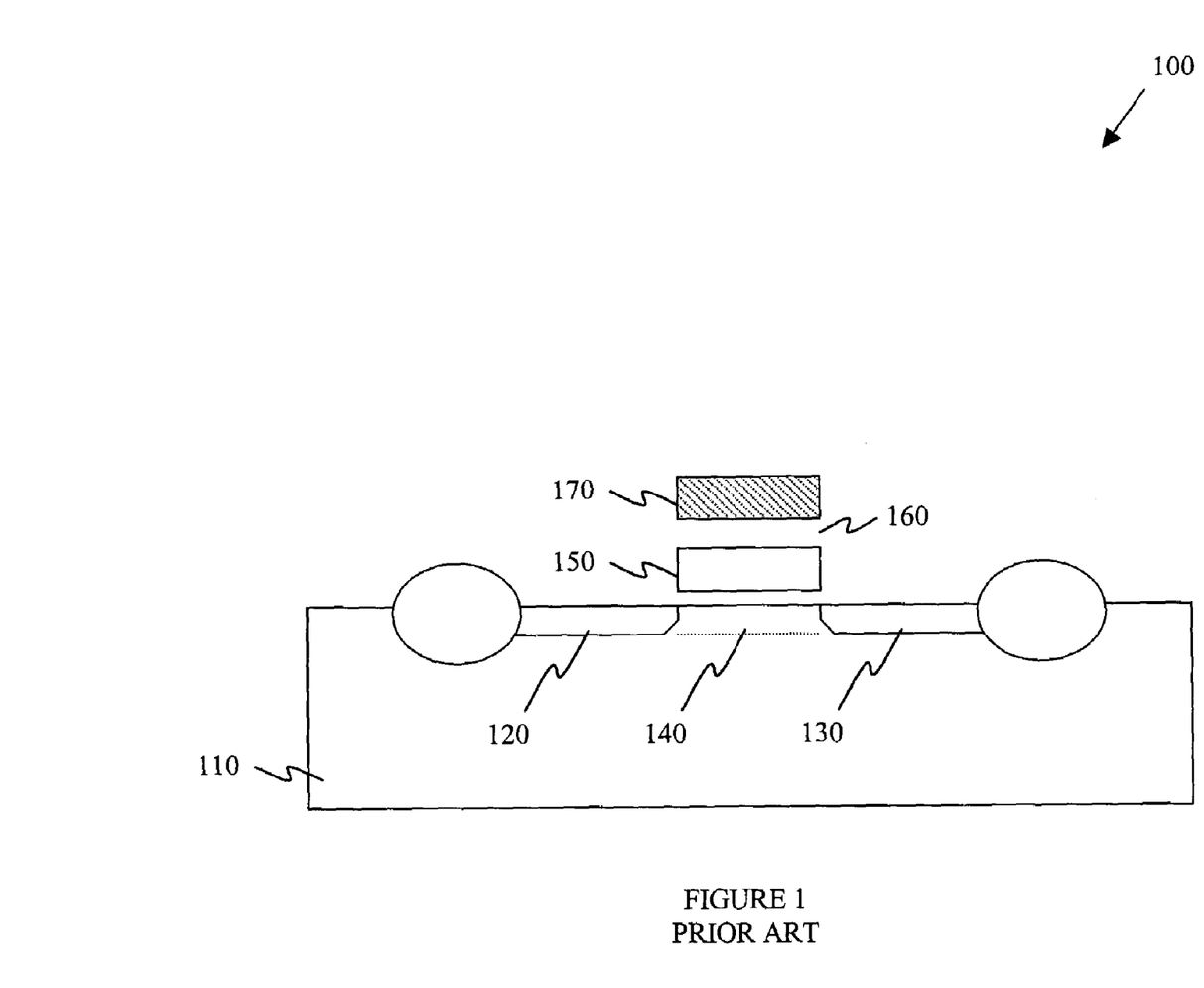
FIG. 1 illustrates a conventional EEPROM device.

Turning to Prior Art FIG. 1 illustrated is a conventional EEPROM device 100. The particular EEPROM device 100 shown in FIG. 1 includes a semiconductor substrate 110 having a source implant 120 and a drain implant 130 located therein. Further located within the semiconductor substrate 110, and defined by the source implant 120 and the drain implant 130, is a channel region 140. The EEPROM device 100 also includes a floating gate 150 having a dielectric layer 160 located thereon. Located on the dielectric layer 160 in FIG. 1 is a control gate 170. While the control gate 170 may comprise a multitude of different materials, metal control gates are gaining widespread use in many different technologies. Most common, however, are metal control gates comprising titanium nitride.

Despite the success of EEPROM cells as a reliable and versatile form of nonvolatile reprogrammable memory, conventional EEPROM devices, such as the one illustrated in FIG. 1, have their drawbacks. One such drawback includes the introduction of alkali ions into the dielectric layer 160 during the manufacture of the metal control gate 170. As the alkali ions are introduced into the EEPROM device 100 at an initial stage of manufacture, subsequent thermal anneal steps often drive the alkali ions into other undesirable portions of the EEPROM device 100, such as the floating gate 150. Conversely, the alkali ions tend to negatively impact the EEPROM device's data retention characteristics. It is believed that changes in the EEPROM device's threshold voltage ($V_T$) caused by the alkali ions, possibly cause the data retention issues.

Accordingly, what is needed in the art is an EEPROM or other semiconductor device that does not suffer from the aforementioned deficiencies found in the prior art.

SUMMARY OF THE INVENTION

To address the above-discussed deficiencies of the prior art, the present invention provides a semiconductor device, a method of manufacture therefor and an integrated circuit including the same. In one embodiment of the invention, the semiconductor device includes a floating gate located over a semiconductor substrate, wherein the floating gate has a metal control gate located thereover. The semiconductor device, in the same embodiment, further includes a dielectric layer located between the floating gate and the metal control gate, the dielectric layer having a gettering material located therein.

The present invention alternatively provides a method of manufacturing a semiconductor device. In one embodiment of the present invention, the method of manufacturing the semiconductor device includes forming a floating gate over a semiconductor substrate and placing a metal control gate over the floating gate. The method further includes locating a dielectric layer between the floating gate and the metal control gate, the dielectric layer having a gettering material located therein.

The present invention further provides an integrated circuit including the semiconductor device. In addition to those features disclosed with respect to the semiconductor device, the integrated circuit includes transistors formed over or in the semiconductor substrate, as well as interconnects connecting the transistors and the semiconductor device to form an integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 2A:
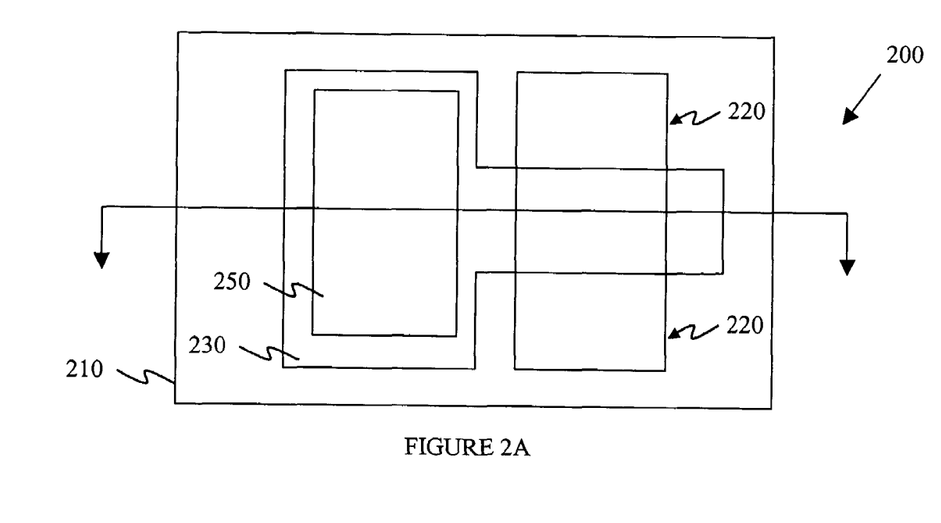
FIGS. 2A and 2B illustrate a plan view and a cross sectional view, respectively, of one embodiment of a semiconductor device constructed in accordance with the principles of the present invention.
Figure 2B:
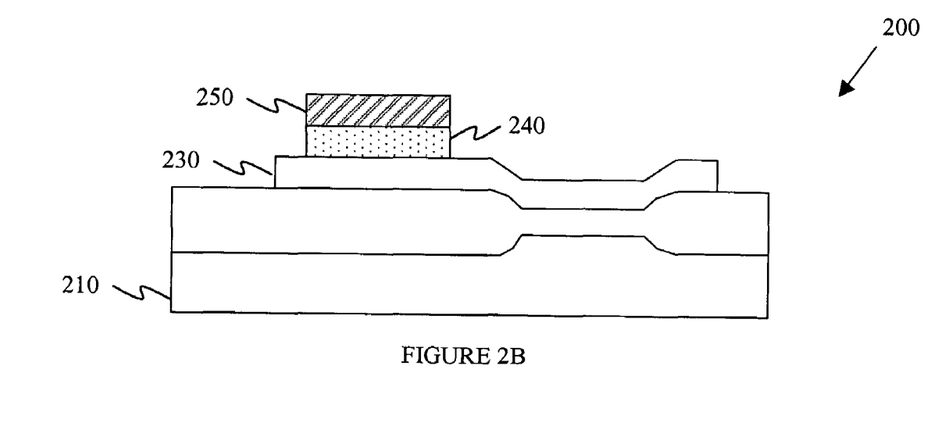

Referring initially to FIGS. 2A and 2B, illustrated are a plan view and a cross sectional view, respectively, of one embodiment of a semiconductor device 200 constructed in accordance with the principles of the present invention. The particular semiconductor device 200 illustrated in FIGS. 2A and 2B, which may in one embodiment be an electrically erasable programable read-only memory (EEPROM), initially includes source/drain regions 220 located within a semiconductor substrate 210. As is illustrated, formed over the semiconductor substrate 210 may be a floating gate 230. Additionally, located over the floating gate 230 may be a metal control gate 250. Optimally located between the floating gate 230 and the metal control gate 250 is a dielectric layer 240. In all embodiments of the present invention, the dielectric layer 240 has a gettering material located therein.

One benefit of the present invention not demonstrated in the prior art devices, is the ability of the gettering material located within the dielectric layer 240 to substantially reduce the movement of undesirable ions within the semiconductor device 200. Particularly, the gettering material located within the dielectric layer 240 is adept at reducing mobile ions from moving large distances during thermal anneal processes, and thereby having a negative effect on the data retention of the device.

Figure 3A:
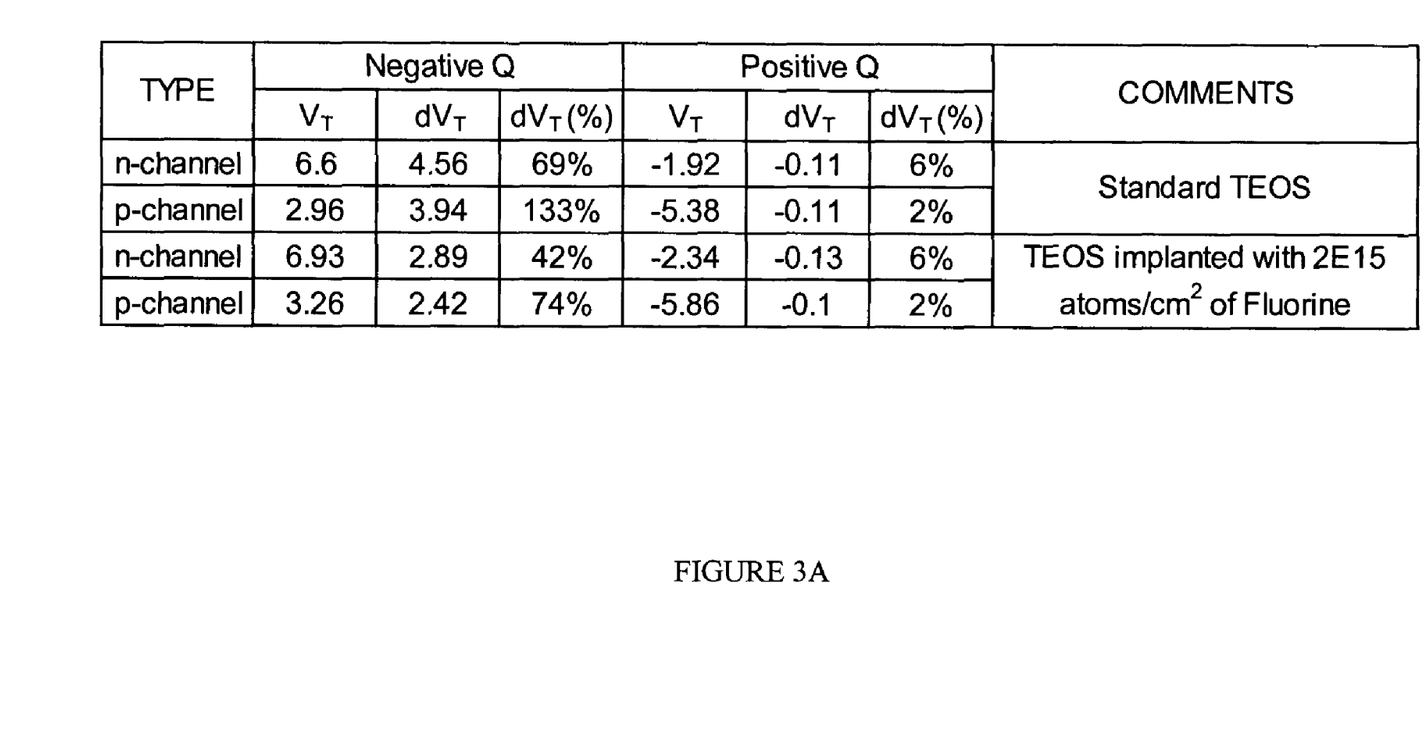
FIGS. 3A and 3B illustrate tables depicting threshold voltage ($V_T$) values for various different semiconductor device layouts, including semiconductor device layouts designed with and without the gettering material located within the dielectric layer.

Turning to FIG. 3A, illustrated is a table 300A depicting threshold voltage ($V_T$) values for various different semiconductor device layouts, including semiconductor device layouts designed with and without the gettering material located within the dielectric layer. The table 300A illustrated in FIG. 3A compares two types of devices (i.e., an n-channel device and a p-channel device) with and without the gettering material located within the dielectric layer, as well as in both the program mode and erase mode.

Referring initially to the program mode (Negative Q), it can be observed that the threshold voltage ($V_T$) value for the n-channel device without the gettering material was initially 6.6 volts and experienced a change in threshold voltage ($dV_T$) of about 4.56 volts after a six-hour bake at 250° C. This change in threshold voltage ($dV_T$) amounts to about a 69 percent change. Likewise, it can be observed that the threshold voltage ($V_T$) value for the p-channel device without the gettering material was initially 2.96 volts and experienced a change in threshold voltage ($dV_T$) of about 3.94 volts. Similarly, this change in threshold voltage ($dV_T$) amounts to about a 133 percent change.

However, referring to the n-channel device and p-channel device including the gettering material, it can be observed that the threshold voltages ($V_T$) were initially 6.93 volts and 3.26 volts, respectively, and that changes in threshold voltage ($dV_T$) of only about 2.89 volts and 2.42 volts were experienced for the n-channel device and p-channel device, respectively. Accordingly, the n-channel device and p-channel device having the gettering material located therein experienced only about a 42 percent and 74 percent change in threshold voltage ($dV_T$), respectively. As is evident, these values are substantially less than those values experienced by the n-channel device and p-channel device without the gettering material located within their respective dielectric layers. As the change in threshold voltage ($dV_T$) values for the devices of the present invention are substantially less than the change in threshold voltage ($dV_T$) values for the prior art devices, the present invention is capable of achieving significantly better data retention than those of the prior art.

Referring now to the erase mode (Positive Q) it can be observed that neither the n-channel device nor the p-channel device, with or without the gettering material, experienced a substantial amount of change in threshold voltage ($dV_T$) after the six-hour bake at 250° C. It is believed that since both the n-channel device and p-channel device during erasing have a positive charge in the floating gate (i.e., a positive potential) the mobile ions are repelled therefrom. Therefore, as it appears, the gettering material has no substantial effect on the erase mode threshold voltage ($V_T$) values.

However, even though the fluorine appears to have no positive effect on the erase mode threshold voltage ($V_T$) values, it also appears to have no negative effect. Accordingly, the benefits experienced by the semiconductor device having the gettering material within the dielectric layer during the program mode greatly outweigh the limited benefits provided by the gettering material to the erase mode threshold voltage ($V_T$) value. For this reason, it is optimal to include the gettering material within the dielectric layer.

Figure 3B:
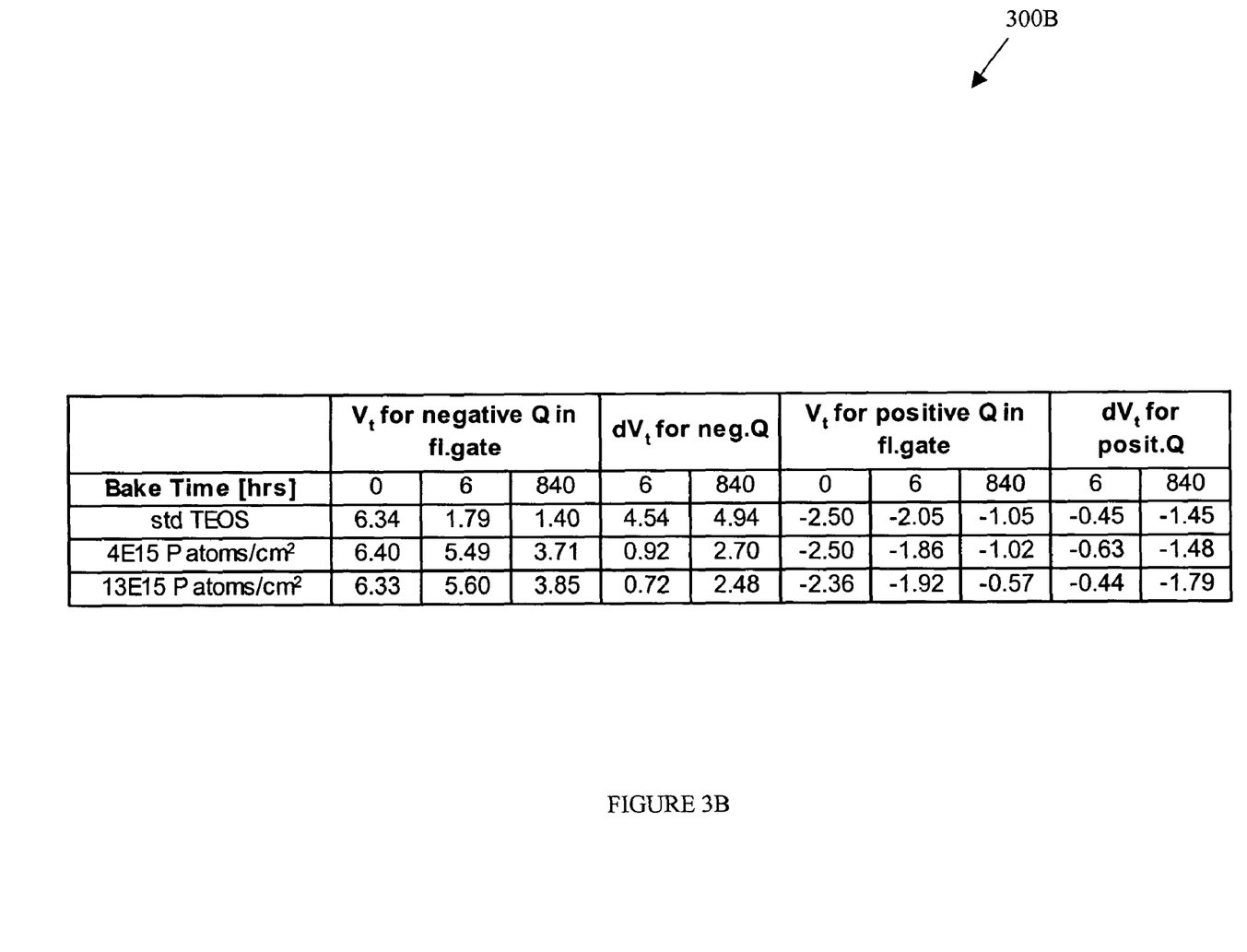

Turning now briefly to FIG. 3B, illustrated is a table 300B depicting threshold voltage ($V_T$) values for three various different semiconductor device layouts, including a first situation without the gettering material located within the dielectric layer, a second situation with the gettering material implanted within the dielectric layer using a dose of about 4E15 atoms/cm$^2$ and a power of about 10 keV, and a third situation with the gettering material implanted within the dielectric layer with a dose of about 13E15 atoms/cm$^2$ and a power of about 10 keV. In the particular embodiment discussed in FIG. 3B, the gettering material is phosphorous, and readings are taken at three different bake times.

In the first situation (i.e., no gettering material located within the dielectric layer) the floating gate lost about 92% of its negative charge after a 6 hour bake and 100% after a 840 hour bake. In the other two situations implanted with phosphorus, the floating gate only lost about 16% of its negative charge after 6 hours of bake and only about 50% of its negative charge after 840 hours of bake. The 840 hours of bake at 250° C. is equivalent to more than 10 years of operation at 125° C., which is the maximum operating temperature for commercial integrated circuits. Accordingly, phosphorus implanted EEPROMs provide a number of benefits over their prior art counterparts.

Figure 4:
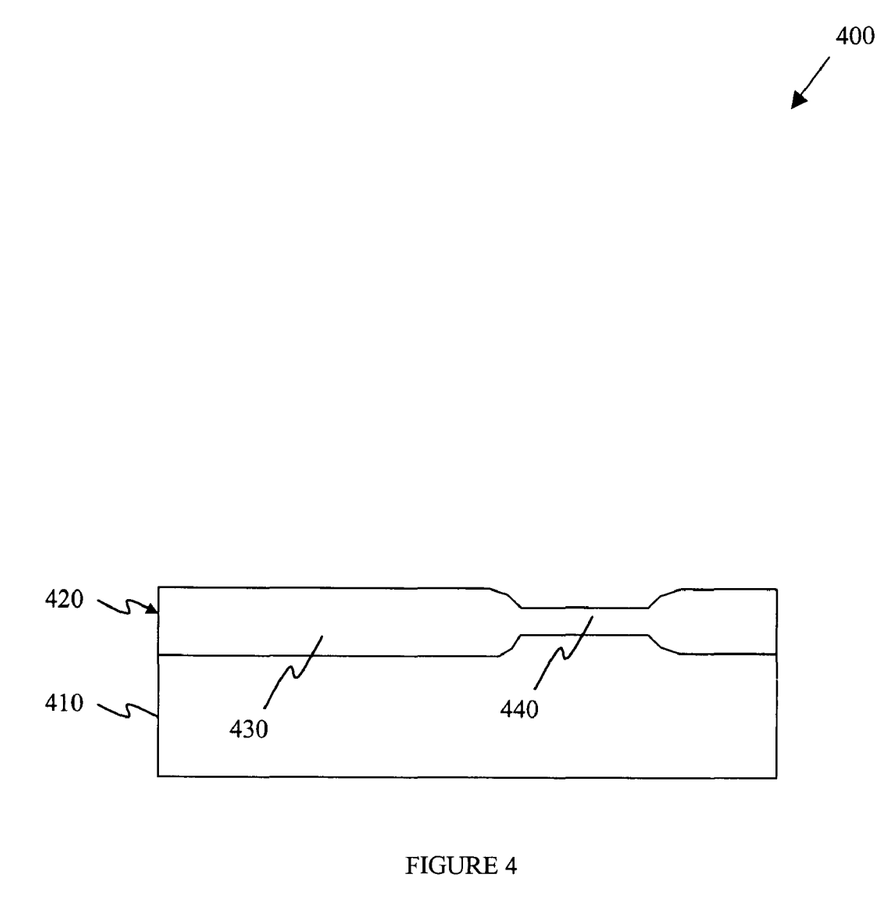
FIG. 4 illustrates a cross-sectional view of an embodiment of a semiconductor device in an initial stage of manufacture.

Turning now to FIGS. 4–8, illustrated are cross-sectional views of various stages of manufacture of a semiconductor device constructed in accordance with the principles of the present invention. Referring to FIG. 4, illustrated is a cross-sectional view of an embodiment of a semiconductor device 400 at an initial stage of manufacture. The method of manufacturing the semiconductor device 400 initiates with the supply of a semiconductor substrate 410. The semiconductor substrate 410 may, in one embodiment, comprise silicon having a p-type or n-type conductivity. Further, the semiconductor substrate 410 may have a 4-degree-off orientation or a <100> $C_z$ crystal structure. The semiconductor substrate 410 may also be a monolithic substrate (p-type or n-type doped) or may have a conventional epitaxial layer located thereon.

Located over the semiconductor substrate 410 in the particular embodiment shown in FIG. 4 is an oxide layer 420. In the particular embodiment shown, the oxide layer 420 contains two different portions having two different thicknesses. One portion of the oxide layer 420 is a field oxide portion 430, wherein the other portion of the oxide layer 420 is a gate oxide portion 440. Depending on the particular design of the semiconductor device 400 the field oxide portion 430 and gate oxide portion 440 may have varying thicknesses. Likewise, depending on the particular design of the semiconductor device 400 the oxide layer 420 may be formed using a number of different technique, including thermal growth, deposition or other similar techniques.

Figure 5:
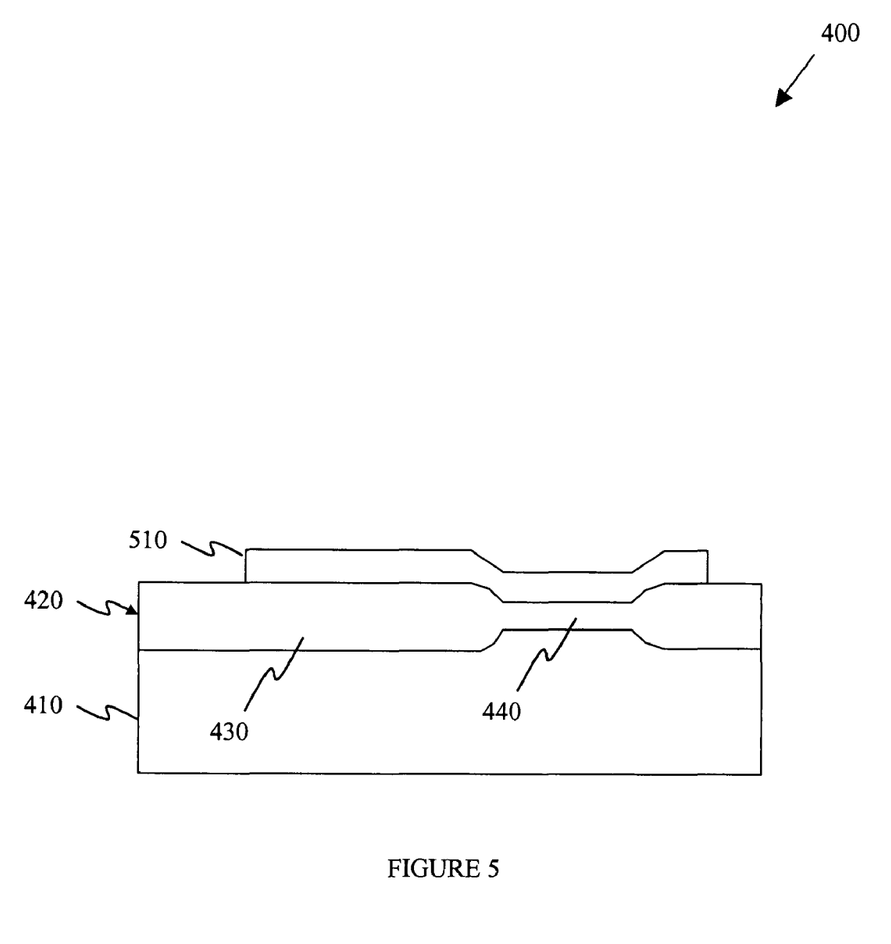
FIG. 5 illustrates a cross-sectional view of the semiconductor device illustrated in FIG. 4 after the blanket deposition and patterning (photo and etch) of a floating gate over the semiconductor substrate.

Turning now to FIG. 5, illustrated is a cross-sectional view of the semiconductor device 400 illustrated in FIG. 4 after the blanket deposition of a floating gate 510 over the semiconductor substrate 410. The floating gate 510 may comprise any conductive material, including polysilicon that is subsequently doped to increase its conductivity. As shown in FIG. 5, the floating gate 510 preferably conforms to the field oxide and gate oxide portions 430, 440 of the oxide layer 420. Typically, the floating gate 510 has a thickness ranging from about 150 nm to about 600 nm.

Figure 6:
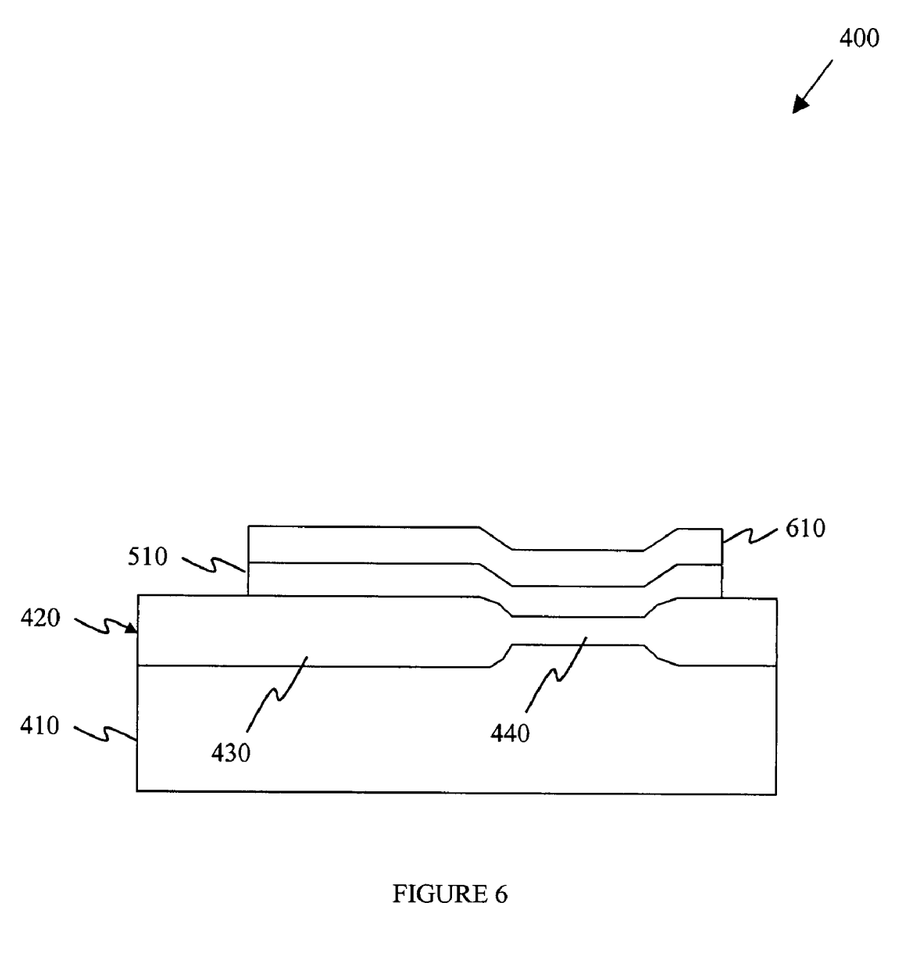
FIG. 6 illustrates a cross-sectional view of the semiconductor device shown in FIG. 5 after forming an insulative layer over the floating gate.

Turning now to FIG. 6, illustrated is a cross-sectional view of the semiconductor device 400 shown in FIG. 5 after forming an insulative layer 610 over the floating gate 510. The insulative layer 610 may comprise silicon dioxide or compounds thereof. For example, one particular embodiment of the present invention has the insulative layer 610 comprising silicon dioxide deposited from a tetraethylorthosilicate (TEOS) material. It is important, however, that the material used for the insulative layer 610 be capable of allowing a gettering material to be included therein.

The insulative layer 610 may be conventionally blanket deposited using, for example a plasma enhanced chemical vapor deposition (PECVD) or other similar process. Similarly, the insulative layer 610 may be formed having a thickness ranging from about 15 nm to about 80 nm.

Figure 7:
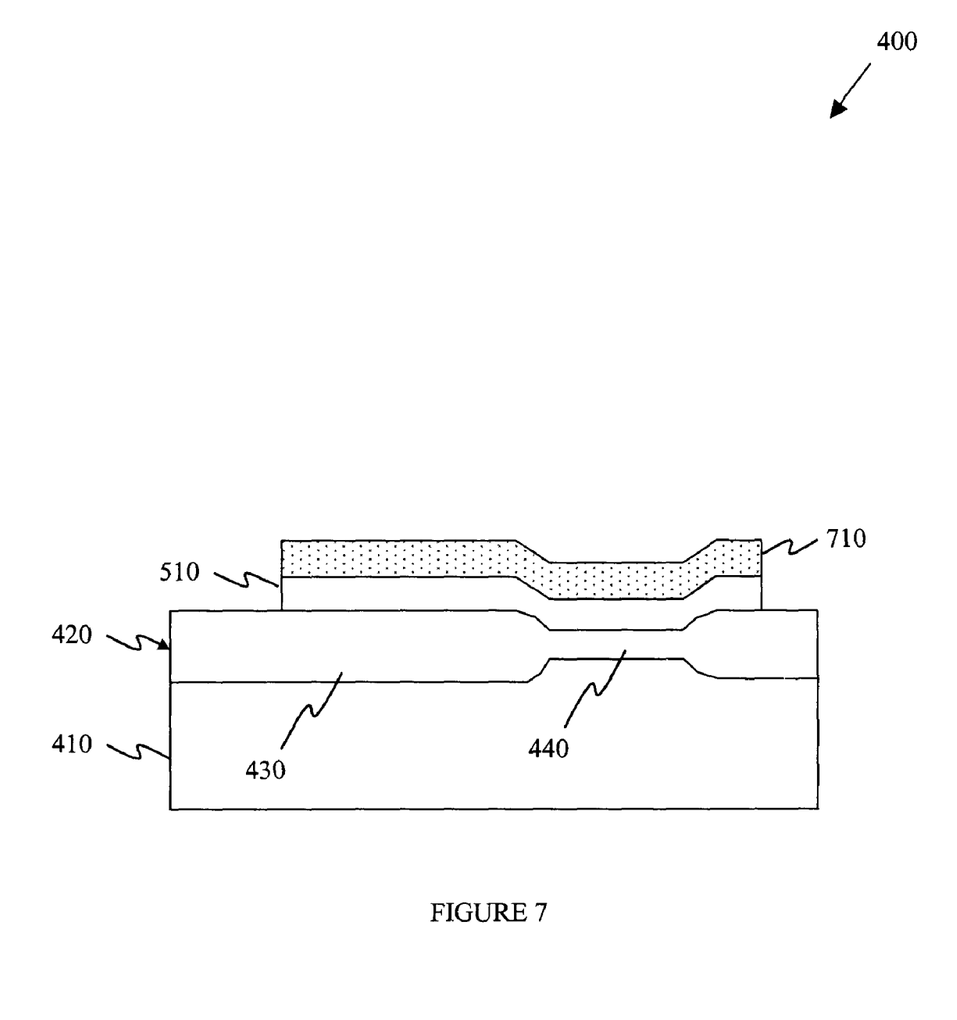
FIG. 7 illustrates a cross-sectional view of the semiconductor device illustrated in FIG. 6 after placing a gettering material in the insulative layer, thereby forming a dielectric layer having the gettering material located therein.

Turning now to FIG. 7, illustrated is a cross-sectional view of the semiconductor device 400 illustrated in FIG. 6 after placing a gettering material in the insulative layer 610, thereby forming a dielectric layer 710 having the gettering material located therein. The gettering material may comprise a number of different substances while staying within the broad scope of the present invention. For example, as long as the gettering material is capable of at least partially gettering the unwanted or undesirable ions (often alkali ions introduced in the formation of the metal control gate-discussed below) from the semiconductor device 400, it may be used. It has been found, however, that gettering materials including a Group 17 element (International Union of Pure & Applied Chemistry (IUPAC) convention) are particularly useful. Further, it is believed that fluorine is an exemplary option as the Group 17 element gettering material. In addition to the getting materials including a Group 17 element, it is believed that certain Group 15 elements will also getter the unwanted or undesirable ions. For example, phosphorus (Group 15 element) forms phosphosilicate glass (PSG) when reacting with silicon dioxide. PSG effectively getters alkali contamination in general, and sodium specifically.

The gettering material may be placed in the insulative layer 610 using a number of different known processes. However, in one exemplary embodiment of the present invention the gettering material is implanted within the insulative layer 610 using a specific dose of the gettering material. While the specific dose used may vary, a dose ranging from about 1E14 atoms/cm$^2$ to about 4E16 atoms/cm$^2$ is particularly useful. Within the aforementioned range of doses, it is believed that a dose of about 2E15 atoms/cm$^2$ provides beneficial results. The implant energy should be low to ensure that the implanted ions do not penetrate the insulative layer 610 but stay prefferably near its top surface. This possible implant energy could be about 10 keV, however, it is strongly dependent on the thickness of the layer of insulative material 610 of which the gettering material is being implanted.

Given the aforementioned parameters, the resulting gettering material concentration within the insulative layer 610 may vary. This value, as one can imagine, is strongly dependent on the thickness of the layer of insulative material 610 of which the gettering material is being implanted. The resulting dielectric layer 710 optimally has a gettering material concentration ranging from about 1E19 atoms/cm$^3$ to about 1E21 atoms/cm$^3$, with a preferred range of about 1E20 atoms/cm$^3$ to about 7E20 atoms/cm$^3$. Moreover, it is believed that an exemplary concentration may be about 4E20 atoms/cm$^3$. While specific doses, concentrations and ranges have been discussed with respect to the dielectric layer 710, the present invention should not be limited to such doses, concentrations and powers.

Figure 8:
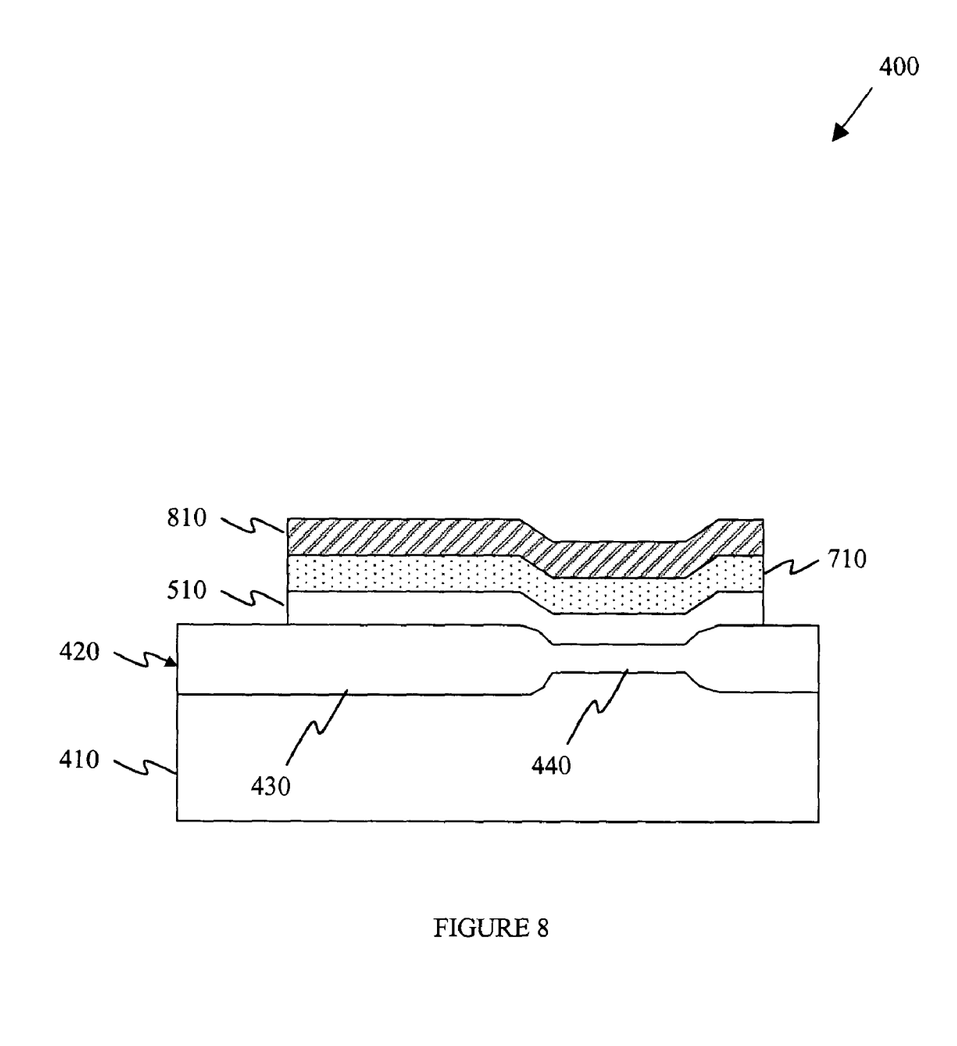
FIG. 8 illustrates a cross-sectional view of the partially completed semiconductor device illustrated in FIG. 7 after forming a metal control gate over the dielectric layer.

Turning now to FIG. 8, illustrated is a cross-sectional view of the partially completed semiconductor device 400 illustrated in FIG. 7 after forming a metal control gate 810 over the dielectric layer 710. The metal control gate 810, which may comprise titanium nitride or another similar material, typically has a thickness ranging from about 100 nm to about 600 nm, and preferably from about 200 nm to about 300 nm. Additionally, the metal control gate 810 may be formed using a number of different methods.

It is believed that the conventional methods used to manufacture the metal control gate 810 are at least partially responsible for allowing the undesirable alkali ions into the dielectric layer 710. For example, it is believed that mobile sodium ions are introduced during the manufacture of the metal control gate 810. Fortuitous to the present invention, but unfortunate to the prior art, the gettering material located within the dielectric layer 710 substantially reduces the mobility of those sodium ions. After completion of the metal control gate 810, the metal control gate 810 and dielectric layer 710 may be simultaneously etched, such as through a single patterned photoresist, resulting in a device similar to the semiconductor device 200 illustrated in FIG. 2.

Figure 9:
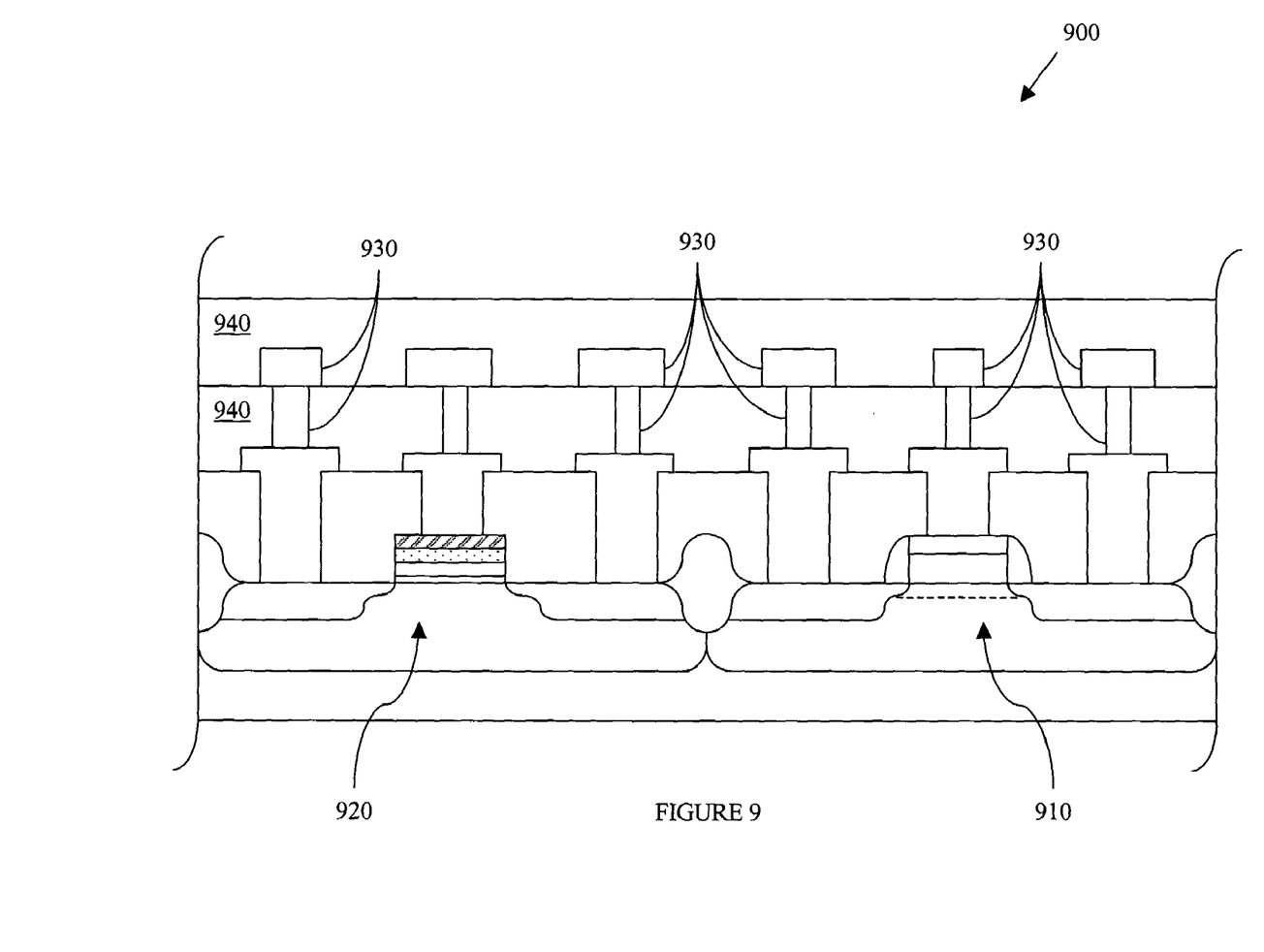
FIG. 9 illustrates a cross-sectional view of one embodiment of an integrated circuit device, which may be one environment within which a semiconductor device constructed according to the present invention may be incorporated.

Turning briefly to FIG. 9, illustrated is a cross-sectional view of one embodiment of an integrated circuit device 900 which may be one environment within which a semiconductor device constructed according to the present invention, such as the semiconductor device 200 shown in FIG. 2, may be incorporated. The integrated circuit device 900 may include active devices 910, such as transistors used to form CMOS devices, bipolar devices, or other types of active devices. The integrated circuit device 900 may also include passive devices (not shown), such as capacitors, inductors or resistors. Those skilled in the art are familiar with these various types of devices and their manufacture.

In the particular embodiment illustrated in FIG. 9, the integrated circuit device 900 also includes one or more memory cells 920, each somewhat similar to the semiconductor device 200 discussed above with respect to FIGS. 2A and 2B. The memory cells 920, in one embodiment, may be EEPROM cells. The integrated circuit device 900 also includes conventional interconnect structures 930 located within one or more interlevel dielectric layers 940 to interconnect the active and/or passive devices to form an operative integrated circuit.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a floating gate located over a semiconductor substrate;
   a metal control gate located over said floating gate; and
   a dielectric layer located between said floating gate and said metal control gate, said dielectric layer having a gettering material located therein.

2. The semiconductor device as recited in claim 1 wherein said gettering material includes a Group 17 element.

3. The semiconductor device as recited in claim 1 wherein said gettering material is fluorine.

4. The semiconductor device as recited in claim 1 wherein said gettering material has a concentration ranging from about 1E19 atoms/cm$^3$ to about 1E21 atoms/cm$^3$.

5. The semiconductor device as recited in claim 1 wherein said concentration ranges from about 1E20 atoms/cm$^3$ to about 7E20 atoms/cm$^3$.

6. The semiconductor device as recited in claim 1 wherein said metal control gate comprises titanium nitride.

7. The semiconductor device as recited in claim 6 wherein said dielectric layer contains alkali ions, and said gettering material getters at least a portion of said alkali ions.

8. The semiconductor device as recited in claim 7 wherein said alkali ions includes sodium ions, and said gettering material getters at least a portion of said sodium ions.

9. The semiconductor device as recited in claim 1 wherein said gettering material is phosphorous.

10. A method of manufacturing a semiconductor device, comprising:
    forming a floating gate over a semiconductor substrate;
    placing a metal control gate over said floating gate; and
    locating a dielectric layer between said floating gate and said metal control gate, said dielectric layer having a gettering material located therein.

11. The method as recited in claim 10 wherein locating further includes implanting said dielectric layer with said gettering material.

12. The method as recited in claim 10 wherein said gettering material includes a Group 17 element.

13. The method as recited in claim 10 wherein said gettering material is fluorine.

14. The method as recited in claim 10 wherein said gettering material has a concentration ranging from about 1E19 atoms/cm$^3$ to about 1E21 atoms/cm$^3$.

15. The method as recited in claim 10 wherein said concentration ranges from about 1E20 atoms/cm$^3$ to about 7E20 atoms/cm$^3$.

16. The method as recited in claim 10 wherein placing a metal control gate includes placing a titanium nitride control gate.

17. The method as recited in claim 16 wherein said dielectric layer contains alkali ions, and said gettering material getters at least a portion of said alkali ions.

18. The method as recited in claim 17 wherein said alkali ions includes sodium ions, and said gettering material getters at least a portion of said sodium ions.

19. The method as recited in claim 10 wherein said gettering material is phosphorous.

20. An integrated circuit, comprising:
    transistors formed over or in a semiconductor substrate;
    memory cells, including:
       a floating gate located over said semiconductor substrate;
       a metal control gate located over said floating gate; and
       a dielectric layer located between said floating gate and said metal control gate, said dielectric layer having a gettering material located therein; and
    interconnects connecting said transistors and said memory cells to form an integrated circuit.

21. The integrated circuit as recited in claim 20 wherein said gettering material is fluorine.

22. The integrated circuit as recited in claim 20 wherein said dielectric layer contains alkali ions, and said gettering material getters at least a portion of said alkali ions.

* * * * *